United States Patent
Miyazaki et al.

(10) Patent No.: US 7,522,510 B2
(45) Date of Patent: Apr. 21, 2009

(54) ELECTRON BEAM APPLYING APPARATUS AND DRAWING APPARATUS

(75) Inventors: Takeshi Miyazaki, Tokyo (JP); Hideyuki Ohyi, Tokyo (JP); Takashi Obara, Kanagawa (JP)

(73) Assignees: Ricoh Company, Ltd., Tokyo (JP); Crestec Corporation, Tokyo (JP)

( * ) Notice: Subject to any disclaimer, the term of this patent is extended or adjusted under 35 U.S.C. 154(b) by 70 days.

(21) Appl. No.: 10/571,776

(22) PCT Filed: Jul. 20, 2005

(86) PCT No.: PCT/JP2005/013683
§ 371 (c)(1), (2), (4) Date: Dec. 13, 2006

(87) PCT Pub. No.: WO2006/009295
PCT Pub. Date: Jan. 26, 2006

(65) Prior Publication Data
US 2007/0085003 A1 Apr. 19, 2007

(30) Foreign Application Priority Data
Jul. 22, 2004 (JP) ............................. 2004-214452
Jun. 24, 2005 (JP) ............................. 2005-184490

(51) Int. Cl.
*G11B 7/00* (2006.01)
(52) U.S. Cl. ..................................... 369/125
(58) Field of Classification Search ............... 369/126, 369/44.23, 44.24, 118, 112.01

See application file for complete search history.

(56) References Cited

U.S. PATENT DOCUMENTS

| | | | |
|---|---|---|---|
| 4,926,055 A | 5/1990 | Miyokawa | |
| 5,446,722 A | 8/1995 | Kojima et al. | |
| 5,830,612 A | 11/1998 | Yamada et al. | |
| 7,053,394 B2 * | 5/2006 | Abe | 250/559.38 |
| 2004/0108458 A1 | 6/2004 | Gerlach et al. | |

FOREIGN PATENT DOCUMENTS

| | | |
|---|---|---|
| JP | 63-276856 | 11/1988 |
| JP | 1-189843 | 7/1989 |
| JP | 4-126344 | 4/1992 |
| JP | 6-19960 | 3/1994 |
| JP | 6-131706 | 5/1994 |
| JP | 9-293652 | 11/1997 |
| JP | 11-273601 | 10/1999 |
| JP | 2003-308122 | 10/2003 |

(Continued)

*Primary Examiner*—Nabil Z Hindi
(74) *Attorney, Agent, or Firm*—Dickstein Shapiro LLP

(57) ABSTRACT

An electron beam applying apparatus includes: a thermal field emission type electron source emitting an electron beam; an electrostatic lens disposed immediately below the electron source and acting as a condensing electrode for condensing the electron beam in a first angular aperture emitted by the electron source in a second angular aperture smaller than the first angular aperture; a condenser lens disposed on a downstream side of the electrostatic lens and condensing the electron beam condensed in the second aperture angel by the electrostatic lens in a crossover point; and an objective lens disposed on a downstream side of the condenser lens and condensing the electron beam condensed in the crossover point by the condenser lens on the surface of the material.

8 Claims, 5 Drawing Sheets

FOREIGN PATENT DOCUMENTS

| | | |
|---|---|---|
| JP | 2003-331480 | 11/2003 |
| JP | 2004-47766 | 2/2004 |
| JP | 2004-71573 | 3/2004 |
| JP | 2004-185786 | 7/2004 |
| JP | 2005-24588 | 1/2005 |
| JP | 2006-59513 | 6/2006 |

\* cited by examiner

ELECTRON BEAM APPLYING APPARATUS AND DRAWING APPARATUS

TECHNICAL FIELD

The present invention relates to an electron beam applying apparatus applying an electron beam on a surface of a material for recording information on the surface of the material, and a drawing apparatus recording information on a surface of a material with the use of an electron beam applied by the electron beam applying apparatus.

BACKGROUND ART

Currently, a DVD (digital versatile disk), which is an optical recording medium having a large storage capacity for which data writing or re-wiring is allowed, exists. A storage capacity of a current DVD-R (recordable) or a DVD-RW (re-writeable) is 4.7 GB (gigabytes) for one side in a single layer, and it has a pattern dimension in which a groove width is on the order of 400 nm, and a track pitch (a width between grooves) is on the order of 740 nm.

In contrast thereto, as a next-generation DVD, an HD-DVD (high definition DVD) exists. A storage. capacity of HD-DVD is on the order of 15 GB for one side in a single layer, has a groove width on the order of 200 through 300 nm, and a track pitch on the order of 600 nm. Further, a storage capacity of a Blu-ray Disk is on the order of 23 through 27 GB for one side in a single layer, has a groove width on the order of 140 through 170 nm, and a track pitch on the order of 320 nm.

Further, a further-next-generation DVD is expected as having a storage capacity on the order of 50 through 100 GB for one side in a single layer. Its groove width may be less than 100 nm, and its track pitch may be on the order of 200 through 300 nm.

For a current DVD, data writing is carried out with an optical mastering apparatus such as a LBR (laser beam recording apparatus). Also for a next-generation HD-DVD, it is expected that writing with an optical mastering apparatus can be made. However, since a pit pattern of a next-generation Blu-ray Disk or a pattern dimension of a further-next-generation DVD is very small, data writing cannot be carried out by an optical mastering apparatus.

Accordingly, in order to write data in a next-generation Blu-ray Disk or a further-next-generation DVD, an electron beam mastering apparatus such as an EBR (electron beam recording apparatus) or such generating an electron beam with a very small beam diameter with a large electric current is required. For example, an electron beam mastering apparatus generating an electron beam with a beam diameter not more than 70 nm, with a large electric current of not less than 400 nA is required.

With reference to FIG. 5, an electron beam applying apparatus in the related art is described.

In an electron beam applying apparatus shown in FIG. 5, an electron beam emitted from an electron source 52 undergoes correction for an axis shift thereof, passes thorough a hole part of a selector aperture (blanking aperture) 60, and after that, is condensed in a crossover point CP by a condenser lens 58. Then, the electron beam from the crossover point CP passes through a hole part of an objective aperture 61, undergoes correction for astigmatism thereof by means of an astigmatism correction coil 62, undergoes correction for a focus thereof by means of an objective lens 66, and is condensed on a surface of a material 70.

When information is written on the material 70, turning on/off of the electron beam emitted by the electron source 52 is controlled by blanking electrodes 54 and the selector aperture 60. Further, the electron beam having passed through the hole part of the selector aperture 60, the condenser lens 58 and the hole part of the objective aperture 61 and applied to the objective lens 66 is deflected by electrostatic deflection electrodes 64 according to information to be written, and thus, a position of a beam spot produced on the material 70 is controlled. That is, the surface of the material 70 is scanned by the electron beam, and thus, information is written in a predetermined position.

In the above-described electron beam applying apparatus 50 in the related art, two methods for increasing an amount of an electric current of the electron beam condensed on the surface of the material 70 can be considered, as follows:

As a first method, as shown in FIG. 6, an effective angular aperture of the electron beam emitted from the electron source 52 is increased, and also, an aperture diameter of the selector aperture 60 is increased (the passage of the electron beam in FIG. 6 is in a zone defined by the inner lines through a zone defined by the outer lines). By increasing the effective angular aperture of the electron beam emitted from the electron source 52, more part of the electron beam can be condensed by the condenser lens 58. Further, by increasing the aperture diameter of the selector aperture 60, more part of the electron beam can be condensed by the objective lens 66. Thereby, an amount of electric current of the electron beam condensed on the surface of the material 70 can be increased.

However, in this method, the angular aperture of the objective lens 66 increases as the aperture diameter of the selector aperture 60 is increased. As spherical aberration of a lens increases in proportion to third power of its angular aperture, a shift in the focal point increases due to a difference in the electron beam passage condensed on the surface of the material 70, occurring due to the spherical aberration of the objective lens 66. Accordingly, it becomes difficult to sufficiently condense the electron beam by means of the objective lens 66, and thus, it may not be possible to sufficiently reduce the beam diameter, or the beam diameter of the electron beam increases.

In the second method, as shown in FIG. 7, the angular aperture of the objective lens 66 is not changed, but the crossover point CP is moved downward (for example, from CP1 to CP2), and thus, a reduction ratio of the beam diameter of the electron beam condensed on the surface of the material 70 with respect to the beam diameter of the electron beam emitted from the electron source 52 is lowered (the passage of the electron beam is, in FIG. 7, in a zone defined by the inner lines through a zone defined by the outer lines). By lowering the beam diameter reduction ratio of the electron beam, the effective angular aperture of the electron beam emitted from the electron source 52 increases, and thus, it is possible to increase the electric current amount of the electron beam condensed on the surface of the material 70.

However, since the beam diameter reduction ratio of the electron beam is thus made smaller, this method can be applied only for a case where the beam diameter of the electron beam emitted by the electron source 52 is originally small, and this method cannot be applied for a case where the beam diameter is originally large, and thus, the beam diameter should be reduced. Further, as the beam diameter reduction ratio of the electron beam is thus made smaller, a positional shift of the electron source 52 due to a possible vibration, a positional shift of the electron source 52 due to a leading voltage (slight voltage shift) or such cannot be ignored, and such a positional shift of the electron source 52 may cause somewhat variation in the electron beam condensed on the surface of the material 70.

Further, as shown in FIG. 5, in the electron beam applying apparatus in the related art, generally, the two apertures, i.e., the selector aperture 60 and the objective aperture 66 are applied. The selector aperture 60 defines the angular aperture of the electron beam applied to the condenser lens 58 from the electron source 52, while the objective aperture 61 defines the angular aperture of the electron beam applied to the objective lens 66 from the crossover point CP. That is, the selector aperture 60 and the objective aperture 61 substantially reduce the electric current amount of the electron beam condensed on the surface of the material 70.

Further, as the two apertures are thus applied, a mechanical error may occur therebetween, and the hole parts thereof may not be aligned on the same axis accurately. Therefore, the hole diameter of the hole part of the selector aperture 60 should be enlarged to include this mechanical error. However, if the hole diameter of the hole part of the selector aperture 60 is thus enlarged, the deflection amount of the electron beam for blanking increases. As a result, a relatively high voltage is required as a blanking voltage, and thus, an increase of a turning on/off switching frequency of the electron beam for blanking becomes difficult. That it, an increase in the drawing speed may not be possible.

Further, in the electron beam applying apparatus 50 in the related art, as shown in FIG. 5, the blanking electrodes 54 and the axis aligning coils 56 are disposed in close proximity. Conventionally, since a large electric current amount of the electron beam is not required, the electric current amount flowing through the blanking electrodes is small. However, when the electric current amount of the electron beam is increased, a large electric current should be made to flow through the blanking electrodes 54, for the purpose of increasing the turning on/off switching frequency of the electron beam for blanking.

However, when a large electric current is flown through the blanking electrodes 54, a magnetic field occurs in the axis aligning coils 56 disposed in close proximity thereto. Thereby, the electron beam is bent, and thus, an axis shift may occur in the electron beam.

Further, conventionally, since a large electric current is not required for the electron beam, the crossover point CP is set at a relatively higher position. Therefore, the beam diameter reduction ratio of the electron beam can be set in a relatively large amount. Thereby, even when somewhat axis shift occurs in the axis aligning coils 56, an influence of the axis shift of the electron beam condensed on the surface of the material 70 can be reduced by several times according to the large reduction ratio. Thus, an influence of the electron beam axis shift in the axis alignment coils 56 does not cause an actual problem.

However, when the crossover point CP is lowered for example as mentioned above for the purpose of increasing the electric current amount of the electron beam, the bema diameter reduction ratio of the electron beam lowers. Thereby, an axis shift of the electron beam in the axis aligning coils 56 may cause a large problem in this case.

As a prior art concerning the present invention, Japanese Laid-open Patent Application No. 6-131706 is cited. This document discloses an information recording apparatus producing an original disk of an information recording medium such as an optical disk. For example, in FIG. 1 thereof, a configuration is disclosed in which an electron emitted by a filament is made to pass through Welnelt electrode and anode as an electron beam applying tube, after that the electron beam is condensed by first and second electromagnetic lenses, further, deflection electrodes are applied, and thus, the electron beam is focused on the original disk serving as a target.

DISCLOSURE OF THE INVENTION

An object of the present invention is to solve the above-mentioned problems based on the related art, and to provide an electron beam applying apparatus generating an electron beam having a large electric current and a minimal beam diameter, and making it possible to carry out drawing at high speed, and a drawing apparatus with the use thereof, with a simple configuration at a low cost.

In order to achieve the object, according to the present invention, an electron beam applying apparatus for applying an electron beam to a surface of a material for recording information on the surface of the material, includes:

a thermal field emission type electron source emitting the electron beam;

an electrostatic lens, disposed immediately below the electron source, acting as a condensing electrode for condensing the electron beam in a first angular aperture emitted by the electron source, in a second angular aperture smaller than the first angular aperture;

a condenser lens disposed on a downstream side of the electrostatic lens, condensing the electron beam once condensed in the second angular aperture by the electrostatic lens, in a crossover point; and an objective lens disposed on a downstream side of the condenser lens, condensing the electron beam once condensed in the crossover point by the condenser lens, on the surface of the material.

There, a beam diameter reduction ratio of the electron beam condensed on the surface of the material with respect to a beam diameter of the electron beam emitted by the electron source when the electrostatic lens is not applied may be preferably set within a range between 1 and 10.

Further, the beam diameter reduction ratio may be further preferably set approximately equal to 1.

Further, an axis aligning coil may be disposed between the electrostatic lens and the condenser lens for correcting an axis shift of the electron beam applied to the condenser lens from the electrostatic lens; and a blanking electrode may be disposed between the condenser lens and the objective lens, deflecting the electron beam condensed in the crossover point by the condenser lens.

Further, an aperture acting both as a selector aperture and as an objective aperture may be disposed between the condenser lens and the objective lens, on a downstream side of the blanking electrode, for controlling turning on/off of the electron beam, together with the blanking electrode, according to information to be written, for a case of writing the information, and the crossover point may be set in the vicinity of and on an upstream or a downstream side of a hole part of this aperture.

Further, according to the present invention, a drawing apparatus is configured to record information on a surface of a material with the use of an electron beam applied by any one of the above-mentioned electron beam applying apparatuses according to the present invention.

In the electron beam applying apparatus according to the present invention, by disposing the electrostatic lens, the electron beam in a range of the first angular aperture emitted by the electron source is applied to the condenser lens. Thereby, it is possible to increase an electric current amount of the electron beam applied to the surface of the material.

Further, a beam diameter of the electron beam emitted by the electron source in the thermal field emission type is in a range between 20 and 50 nm, and thus a sufficiently minimal beam diameter is obtained. Accordingly, it is possible to increase the electric current amount of the electron beam condensed on the surface of the material by setting a beam diameter reduction ratio of the electron beam to be smaller for a case where the electrostatic lens is not disposed.

Further, by disposing the electrostatic lens, an apparent position of the electron source with respect to the condenser lens is more distant than that of the actual position of the electron source. Accordingly, the beam diameter reduction ratio of the electron beam for the case where the electrostatic lens is disposed becomes larger than that of the case where the electrostatic lens is not disposed. Thereby, an influence of a possible vibration of the electron source on the electron beam condensed on the surface of the material is reduced.

Furthermore, since the electron beam applying apparatus according to the present invention has a very simple configuration in which the thermal field emission type electron source is applied, and the electrostatic lens is disposed, it is possible to generate an electron beam with a large electric current with a minimal beam diameter at a low cost.

Further, by setting the crossover point in the proximity to the hole part of the aperture acting both as the selector aperture and as the objective aperture, it is possible to reduce the hole diameter of the hole part, and to reduce a deflection amount of the electron beam for blanking. Thereby, it is possible to make the blanking voltage relatively low, and to increase an electron beam tuning on/off switching frequency for blanking. That is, it is possible to achieve high speed drawing.

Further, in the electron beam applying apparatus according to the present invention, the axis aligning coil and the blanking electrode are disposed apart. Accordingly, even when a large electric current is made to flow through the blanking electrodes for the purpose of increasing the electron beam turning on/off switching frequency for blanking, its electromagnetic interference does not occur in the axis aligning coil. As a result, it is possible to avoid a situation in which magnetic field occurs in the axis aligning coils, the electron beam is bent, and thus, an axis error occurs in the electron beam.

Further, in the drawing apparatus according to the present invention, since information is recorded on a surface of a material with the use of an electron beam emitted by any one of the above-mentioned electron beam applying apparatuses, it is possible to carry out, with a simple configuration at a low cost, drawing at high speed with the use of the electron beam with a large electric current and a minimal beam diameter.

BEST MODE FOR CARRYING OUT THE PRESENT INVENTION

Based on a preferable embodiment shown in figures, an electron beam applying apparatus and a drawing apparatus employing it according to the present invention are described in detail.

Figure 1:
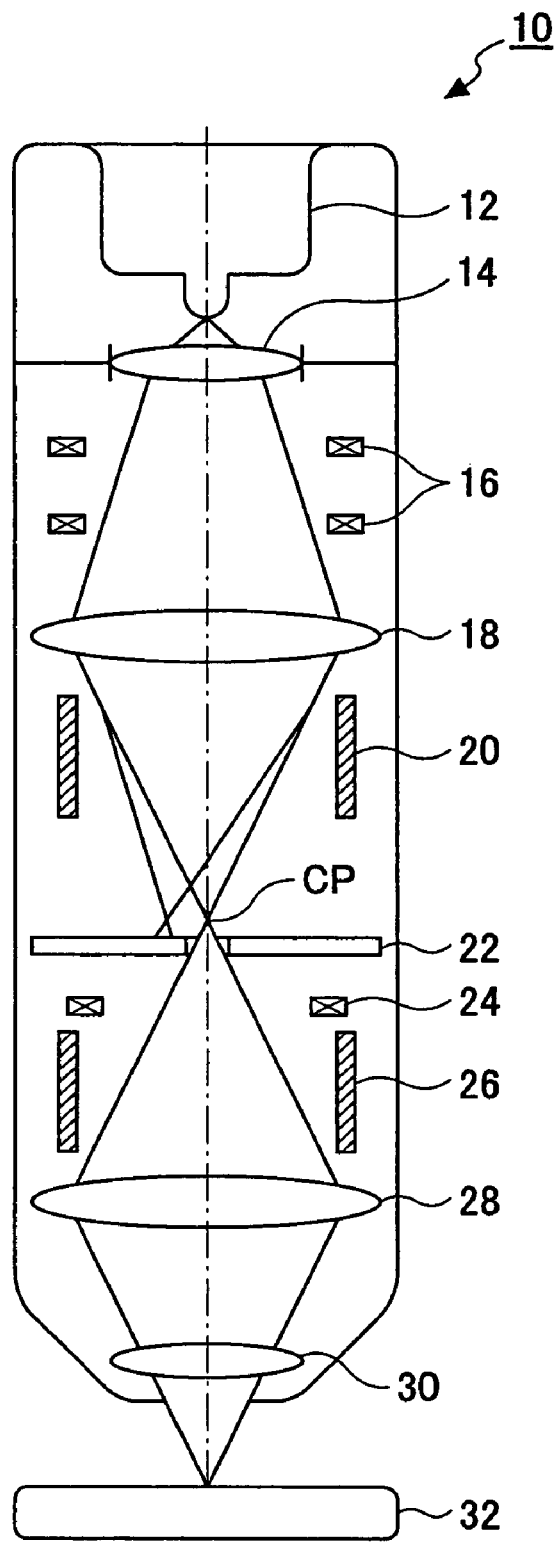
FIG. 1 shows an outline of one embodiment of an electron beam applying apparatus according to the present invention.
Figure 2:
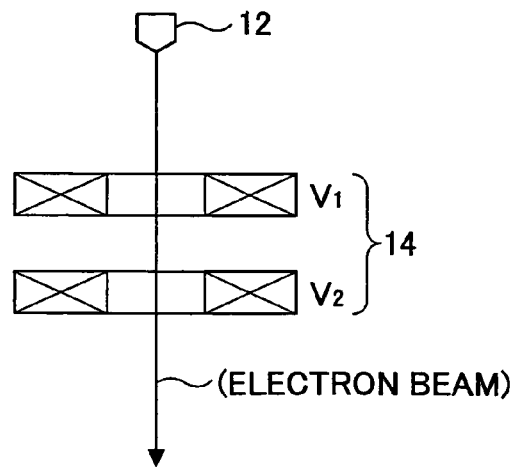
FIG. 2 shows a configuration of an electrostatic lens applied in the electron beam applying apparatus shown in FIG. 1.

FIG. 1 shows an outline of an embodiment of an electron beam applying apparatus according to the present invention. The electron beam applying apparatus 10 shown is used to apply an electron beam on a surface of a material 32 for the purpose of recording information on the surface of the material 32 (for example, an optical medium such as a DVD), and includes an electron source 12, an electrostatic lens 14, axis aligning coils 16, a condenser lens 18, blanking electrodes 20, an aperture 22 acting both as a selector aperture and as an objective aperture, an astigmatism correction coil 24, electrostatic deflection electrodes 26, an objective lens 28 and a dynamic focal correction lens 30.

In the electron beam applying apparatus 10 shown, the electron source (electron gun) 12 is of a thermal field emission type, and is disposed in an ultra-high vacuum. An electron beam is emitted from the electron source 12 downward in FIG. 1.

The electron beam emitted by the electron source 12 has a sufficiently minimal beam diameter, i.e., on the order of a range between 20 and 50 nm. Thereby, it is not necessary to set a beam diameter reduction ratio of the electron beam condensed on the surface of the material 32 with respect to the beam diameter of the electron beam emitted by the electron source 12 to be large, in terms of obtaining an electron beam having a minimal beam diameter. In the case of the present embodiment, a setting is made such that the beam diameter reduction ratio for a case where the electrostatic lens 14 is not applied may be approximately equal to 1.

The electrostatic lens 14 is made of a condensing electrode condensing the electron beam in a range of a first angular aperture emitted by the electron source 12, in a range of a second angular aperture smaller than the first angular aperture, and is disposed immediately below the electron source 12.

In the present embodiment, the electrostatic lens 14 is made of a pair of cylindrical lenses to which different voltages V1 and V2 are applied, respectively. However, the electrostatic lens 14 is not limited thereto, and those of various types may be applied instead.

There, as the condensing electrode, a magnetic lens may be applied. However, when the magnetic lens is applied, a degree of vacuum around the electron source 12 may degrade due to gas emitted by a coil included in the magnetic lens, and the recording performance of the electron beam applying apparatus may degrade accordingly. Further, the gas emitted by the coil is ionized by a magnetic field, the ions hit an emitter of the electron source, and thus, the life thereof may be shortened. Therefore, the electrostatic lens 14 is applied as the condensing electrode in the electron beam applying apparatus 10.

Next, the condenser lens 18 is made of an electromagnetic lens condensing the electron beam condensed in the second angular aperture by means of the electrostatic lens 14, in a crossover point CP. The objective lens 28 is made of an electromagnetic lens condensing the electron beam condensed in the crossover point CP by means of the condenser lens 18, on the surface of the material 32. The dynamic focal correction lens 30 is used to correct a focal point of the electron beam to cause it to coincide with the surface of the material 32. The above-mentioned condenser lens 18, the objective lens 28 and the dynamic focal correction lens 30 are disposed in the stated order on a downstream side of the electrostatic lens 14.

The axis aligning coils 16 are disposed between the electrostatic lens 14 and the condenser lens 18. The axis aligning coils are used to correct an axis shift of the electron beam applied to the condenser lens 18 from the electrostatic lens 14.

The blanking electrodes 20, the aperture 22 acting both as the selector aperture and as the objective aperture, the astigmatism correction coil 24 and the electrostatic deflection electrodes 26 are disposed in the stated order between the condenser lens 18 and the objective lens 28.

The blanking electrodes 20 and the aperture 22 acting both as the selector aperture and as the objective aperture are used to control the electron beam tuning on (writing)/off (stop writing), when writing information, according to the information to be written. That is, when deflection of the electron beam is not carried out by the blanking electrodes 20, the electron beam is applied (turning on) to the surface of the material 32 after passing through the hole part of the aperture 22 acting both as the selector aperture and as the objective aperture. On the other hand, as a result of the electron beam being deflected by the blanking electrodes 20, the electron beam is shut off (turning off) by means of the aperture 22 acting both as the selector aperture and as the objective aperture.

The astigmatism correction coil 24 is used to correct astigmatism of the electron beam. The electrostatic deflection electrodes 26 controls a spot position of the electron beam on the surface of the material 32 by deflecting the electron beam according to information to be written when the information is written on the surface of the material 32.

In the electron beam applying apparatus 10 shown in FIG. 1, the electron beam emitted by the electron source 12 in the range of the first angular aperture is condensed in the range of the second angular aperture by means of the electrostatic lens 14; an axis shift of the electron beam is corrected by the axis aligning coils 16; and the electron beam is condensed in the crossover point CP by means of the condenser lens 18. Then, the electron beam having passed through the hole part of the aperture 22 acting both as the selector aperture and as the objective aperture undergoes correction of astigmatism thereof by means of the astigmatism correction coil 24; the focal point of the electron beam is corrected by the dynamic focal correction lens 30; and the electron beam is condensed on the surface of the material 32.

When information is written, the blanking electrodes 20 and the aperture 22 acting both as the selector aperture and as the objective aperture control turning on/off of the electron beam condensed by the condenser lens 18. Further, the electron beam having passed through the hole part of the aperture 22 acting both as the selector aperture and as the objective aperture and being applied to the objective lens 28 is deflected by the electrostatic deflection electrodes 26 according to the information to be written, and thus, a spot position thereof on the surface of the material 32 is controlled. That is, the surface of the material 32 is scanned by the electron beam, and thus, the information is written in a predetermined position.

As described above, the beam diameter of the electron beam emitted by the electron source 12 in the thermal field emission type is sufficiently minimal, i.e., on the order of the range between 20 and 50 nm. Therefore, the beam diameter of the electron beam condensed on the surface of the material 32 becomes sufficiently minimal even without making a setting of the beam diameter reduction ratio of the electron beam to be large. Accordingly, by making a setting of the beam diameter reduction ratio of the electron beam to be small as in the present embodiment, it is possible to increase an electric current amount of the electron beam condensed on the surface of the material 32.

The beam diameter reduction ratio of the electron beam for a case where the electrostatic lens 14 is not applied may be preferably set in a range between 1 and 10 in terms of increasing the electric current amount of the electron beam condensed on the surface of the material 32, and may be most preferably set in approximately 1 as in the present embodiment.

Further, as mentioned above, in the electron beam applying apparatus 10, the electron beam emitted from the electron source 12 in the range of the first angular aperture is condensed in the range of the second angular aperture by the electrostatic lens 14, and the electron beam is applied to the condenser lens 18. That is, the electron beam in the range of the first angular aperture emitted by the electron source 12 is applied to the condenser lens 18. Thereby, it is possible to further increase the electric current amount of the electron beam condensed on the surface of the material 32.

Figure 3:
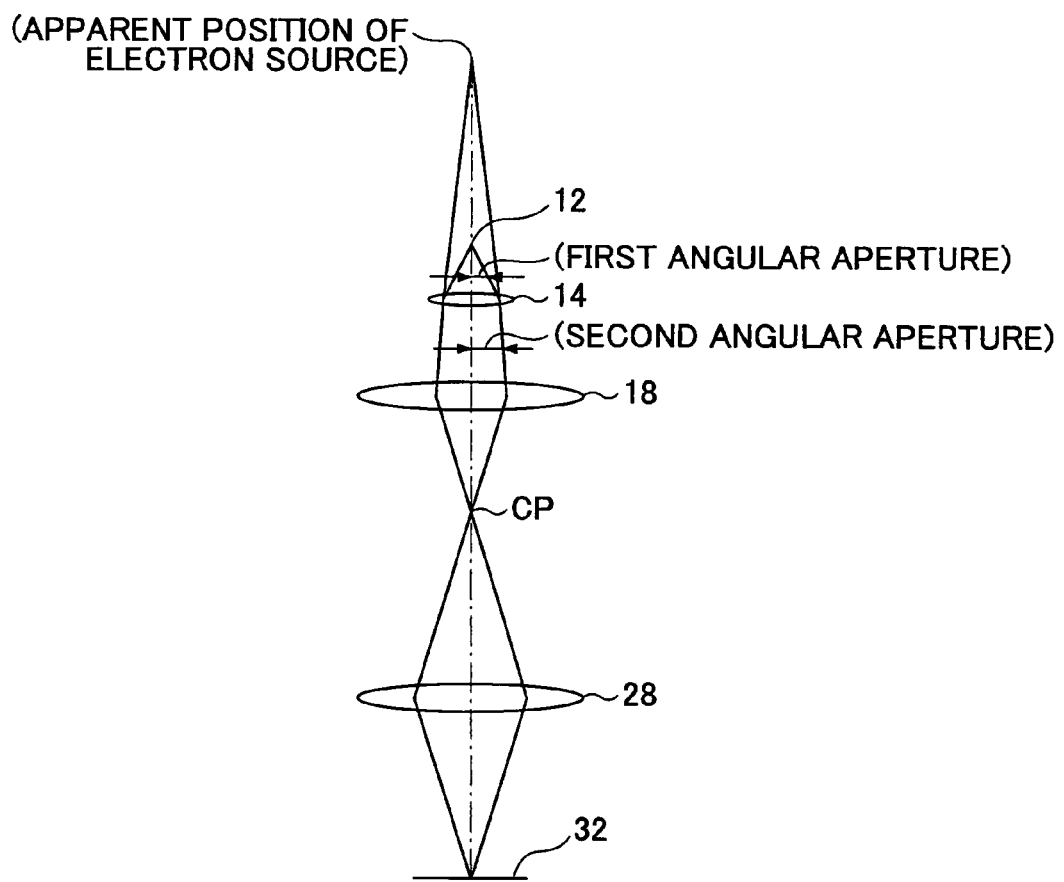
FIG. 3 shows an outline of a state of an electron beam in the electron beam applying apparatus shown in FIG. 1.

Further, as shown in FIG. 3, by disposing the electrostatic lens 14, an apparent position of the electron source 12 with respect to the condenser lens 18 is located more distant than the actual position of the electron source 12 (in FIG. 3, apparently, the electron source 12 seems to be located higher than the actual position). Accordingly, in the present embodiment, although the beam diameter reduction ratio of the electron beam for the case where the electrostatic lens 14 is not applied is set in approximately 1, the actual beam diameter reduction ratio for the case where the electrostatic lens 14 is applied becomes more than 1 depending on the first and second angular apertures.

Thus, in comparison to the case where the electrostatic lens 14 is not applied, the actual beam reduction ratio of the electron beam increases for the case where the electrostatic lens 14 is applied. Thereby, an influence of a possible vibration of the electron source 12 on the electron beam condensed on the surface of the material 32 is reduced. Further, since the electron beam applying apparatus 10 has a very simple configuration of employing the electron source 12 in the thermal field emission type and disposing the electrostatic lens 14, it is possible to generate the electron beam of a large electric current with a minimal beam diameter at a low cost.

Figure 5:
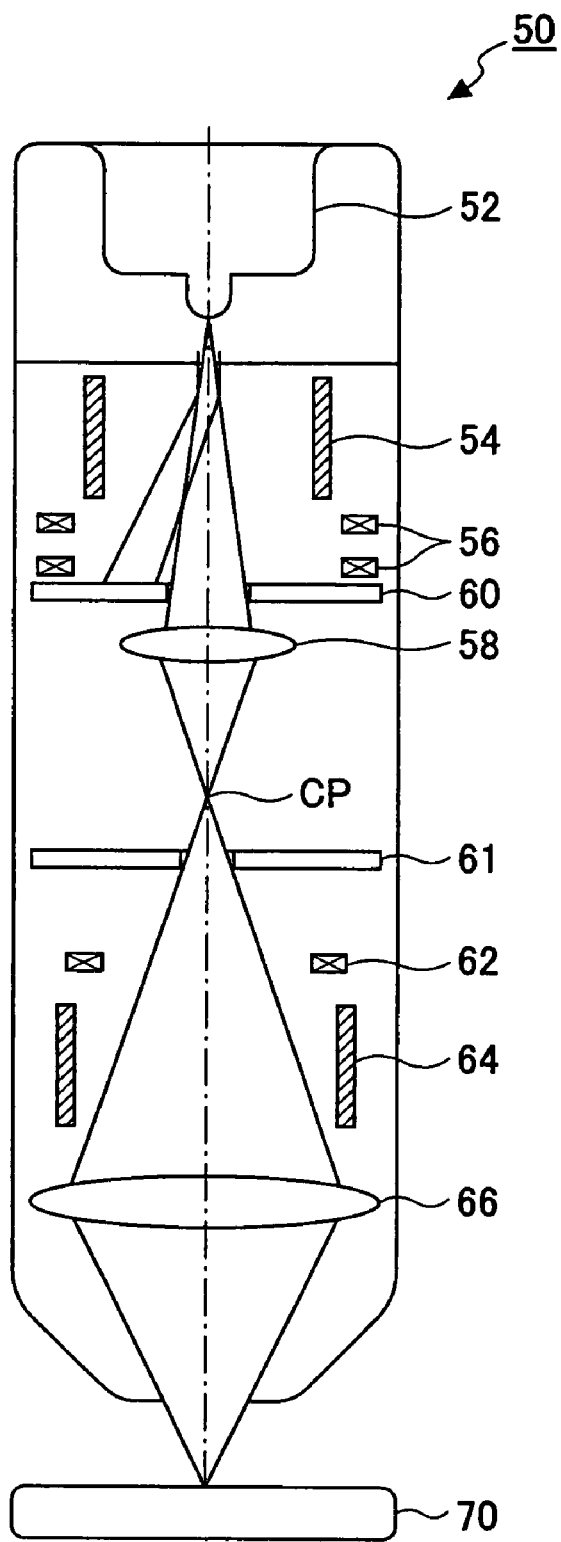
FIG. 5 shows an outline of one example of an electron beam applying apparatus in the related art.
Figure 6:
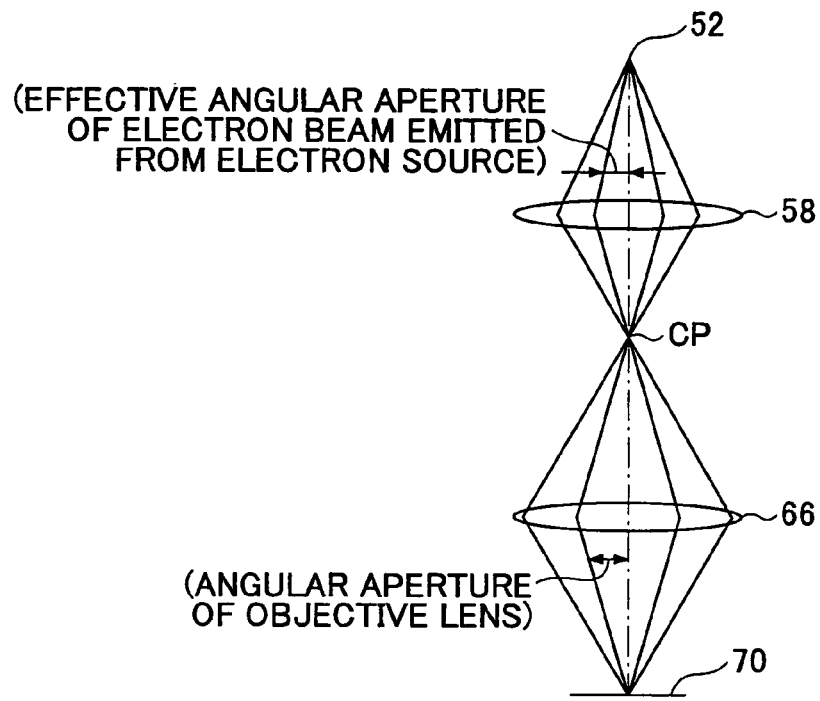
FIGS. 6 and 7 show outlines of states of an electron beam in the electron beam applying apparatus shown in FIG. 5.
Figure 7:
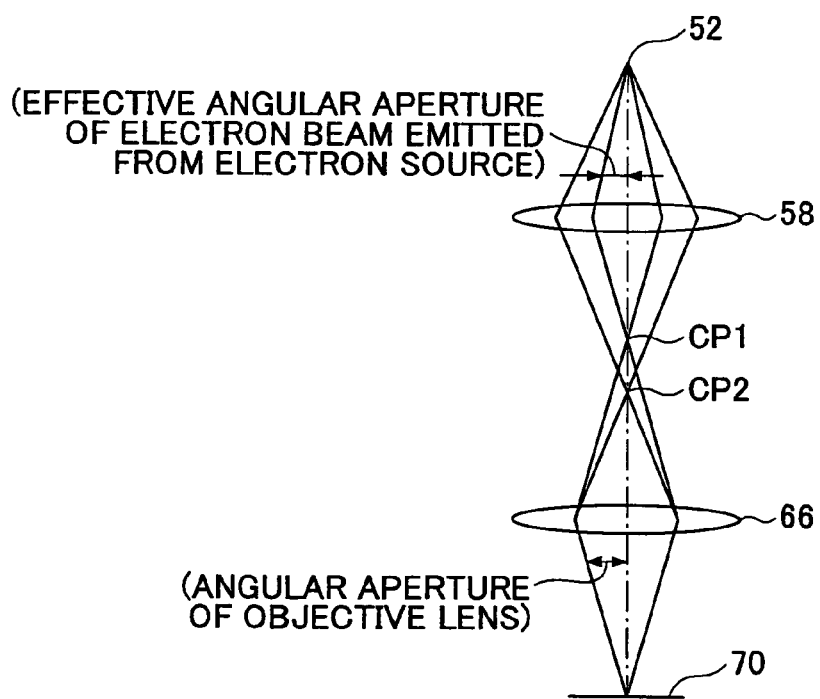

Further, as can be seen from a comparison between the electron beam applying apparatus 10 in the embodiment shown in FIG. 1 and the electron beam applying apparatus 50 in the related art shown in FIG. 5, only the aperture 22 acting both as the selector aperture and as the objective aperture is applied as an aperture in the embodiment of the present invention. The aperture 22 acting both as the selector aperture and as the objective aperture has both functions as the selector apertures 60 and the objective aperture 61 of the electron beam applying apparatus 50 (The aperture 22 acting both as the selector aperture and as the objective aperture integrally includes both the functions of the selector apertures 60 and the objective aperture 61).

In the electron beam applying apparatus 10 in the present embodiment, the crossover point CP is set in the vicinity of the hole part of the aperture 22 acting both as the selector aperture and as the objective aperture. Thereby, the hole diameter of the hole part of the aperture 22 acting both as the selector aperture and as the objective aperture can be shortened in the order of a range between 40 and 100 μm, for example. When the hole diameter of the hole part of aperture 22 acting both as the selector aperture and as the objective aperture is thus made smaller, the deflection amount of the electron beam for blanking can be made smaller. Thereby, the blanking voltage can be made relatively lower, and the electron beam turning on/off switching frequency for blanking can be increased. That is, drawing can be carried out at high speed.

In the electron beam applying apparatus 10 in the present embodiment shown in FIG. 1, the crossover point CP is set above, in the vicinity of the hole part of the aperture 22 acting both as the selector aperture and as the objective aperture, and the angular aperture of the electron beam is controlled by the downstream-side (bottom surface side) inner circumferential edge of the hole part of aperture 22 acting both as the selector aperture and as the objective aperture. In contrast thereto, the crossover point CP may be set below, in the vicinity of the hole part of aperture 22 acting both as the selector aperture and as the objective aperture, and the angular aperture of the electron beam may be controlled by the upstream-side (top surface side) inner circumferential edge of the hole part of aperture 22 acting both as the selector aperture and as the objective aperture.

Further, in the electron beam applying apparatus 10 in the present embodiment, the axis aligning coils 16 are disposed between the electrostatic lens 14 and the condenser lens 18, and the blanking electrodes 20 are disposed between the condenser lens 18 and the objective lens 28 (between the condenser lens 18 and the aperture 22 acting both as the selector aperture and as the objective aperture). That is, the axis aligning coils 16 and the blanking electrodes 20 are disposed apart. As described above, when the electric current amount of the electron beam is increased, a large electric current should be made to flow through the blanking electrodes 20 for increasing the electrode turning on/off switching frequency.

In the electron beam applying apparatus 10 in the present embodiment, since both are disposed apart as mentioned above, an electromagnetic influence of a large electric current flowing through the blanking electrodes 20 do not occur in the axis aligning coils 16, even when the large electric current is made to flow through the blanking electrodes 20. As a result, a problematic situation in which an axis shift occurs as a result of the electron beam being bent due to a magnetic field occurring in the axis aligning coils 16 can be avoided. Accordingly, even when the crossover point CP is set at a relatively lower position, for example, for the purpose of achieving a large electric current of the electron beam, and thus the reduction ratio is made smaller, an influence of an axis shift of the electron beam in the axis aligning coils 16 hardly occurs.

The electron beam applying apparatus 10 shown in FIG. 1 has been described above as one example, and an electron beam applying apparatus according to the present invention is not limited to this configuration. For example, in the embodiment of FIG. 1, the condenser lens 18 and the objective lens 28 are in single stages, respectively. However, each thereof may be configured in multiple stages. Further, such respective components as the aperture 22 acting both as the selector aperture and as the objective aperture, the astigmatism correction coil 24, the electrostatic deflection electrodes 26 and the dynamic focal correction lens 30 may be applied as the necessary arises, and any other types may also be applied instead.

A drawing apparatus according to the present invention is described next.

Figure 4:
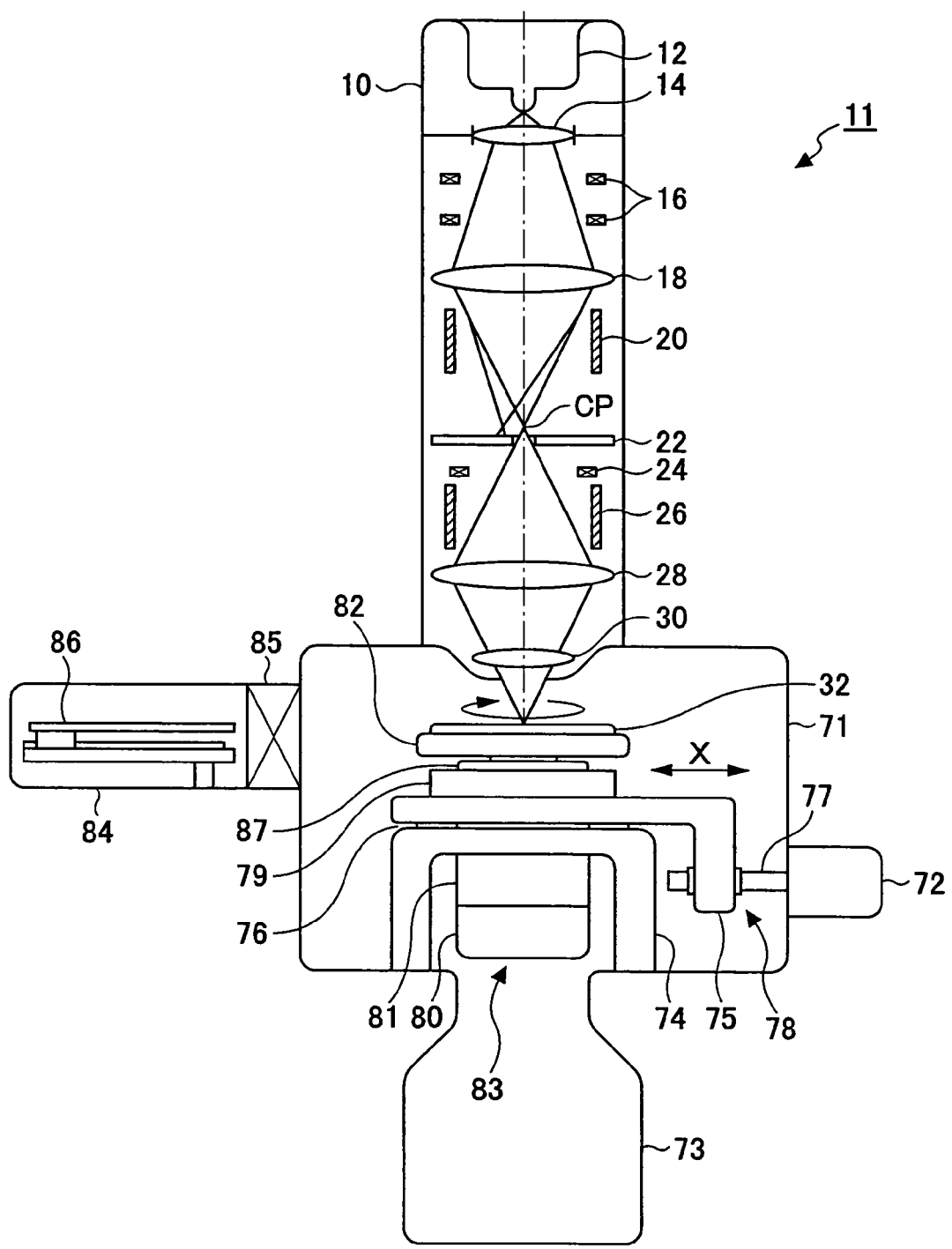
FIG. 4 shows an outline of one embodiment of a drawing apparatus according to the present invention.

FIG. 4 shows an outline of an embodiment of a drawing apparatus according to the present invention. The drawing apparatus 11 shown is an electron beam drawing apparatus recording information on a surface of a material 32 with the use of the electron beam applied from the electron beam applying apparatus 10 shown in FIG. 1. The electron beam drawing apparatus is mounted on a top of a vacuum chamber 71 placed on a vibration removing (vibration-free) mechanism (for example, a servo mounter with the use of air pressure, or such) not shown, in such a manner that the electron beam emitted by the electron beam applying apparatus 10 may be applied to the surface (drawing surface) of the material 32 approximately perpendicularly.

A substrate 74 is provided inside of the vacuum chamber 71, and, on a top end surface thereof, a movable body 75 is disposed via a roller bearing 76 in which spherical or cylindrical rollers or such are disposed in a feeding direction (a direction of an arrow X of FIG. 4). The moveable body 75 is L-shaped in a cross section as shown in FIG. 4, and a screw hole part is produced in a right end part of the movable body 75. In the screw hole part, a screw hole is provided in which a feeding screw 77 which is a rotation shaft of a feeding driving motor 72 described below is fit.

The feeding driving motor 72 is disposed in a bottom right part of the vacuum chamber 71 in FIG. 4, and has the feeding screw 77, such as a ball screw, as the rotation shaft thereof. As mentioned above, the feeding screw 77 is fit in the screw hole of the screw hole part of the movable body 75. That is, a feeding mechanism 78 is configured in which, as a result of the feeding screw being rotated with a power supply signal not shown to the feeding driving motor 72, the movable body 75 is freely moved in the arrow X direction (horizontal direction in FIG. 4), in a state in which the material 72 is placed on a rotating table 82 described later.

On a top surface of the movable body 75, an air spindle 87 is fixed which floats hydrostatically in radial and thrust directions by means of compressed air not shown provided externally. On a top side surface of the air spindle 87, the rotating table 82 on which the material 72 is placed is fixed. For a case where the air spindle 87 is provided in a reduced pressure (vacuum) condition, a seal mechanism such as a magnetic fluid seal, a different pressure air discharging seal or such is provided in the periphery of the air spindle 87 for achieving a vacuum seal, generally.

In a top left part of the vacuum chamber 71 in FIG. 4, a load lock 84 is disposed via a stop valve 85. In the load lock 84, a conveyance unit 86 for the material 32 is provided. By means of the conveyance unit 86, the material 32 is introduced in the vacuum chamber 71, or the material 32 is ejected from the vacuum chamber 71. At the bottom of the vacuum chamber 71, a vacuum pump 73 such as a turbo-molecular pump or such is provided in a communicating condition. During drawing, as described above, a vacuum is formed in the vacuum chamber 71 therewith.

Below the air spindle 87, an optical rotary encoder 80 is fixed providing an output of A phase and B phase pulses generated from thousands of divisions a turn and a Z phase pulse generated a turn. That is, a rotating mechanism 83 is configured for freely rotating the air spindle 87, that is, the rotating table 82 in a direction of rotating arrow shown in FIG. 4, and thereby, the material 32 is made to freely turn according to a power supply signal not shown provided to a rotating driving motor 81.

When information is recorded on the surface of the material 32, the material 32 is introduced in the vacuum chamber 71 by the conveyance unit 86 in the load lock 84, and is placed on the rotating table 82. Then, the vacuum pump 73 forms a predetermined vacuum condition in the vacuum chamber 71.

When drawing is carried out, the rotating table 82, that is, the material 32 is made to turn at a predetermined speed in the rotating arrow direction, by means of the rotating driving motor 81 and the optical rotary encoder 80, and also, the material 32 is moved in a predetermined direction along the arrow X direction as a result of the feeding screw 77 being rotated in a predetermined direction by the deriving motor 72. In this condition, information is recorded on the surface of the material 32 two-dimensionally by means of the electron beam emitted by the electron beam applying apparatus 10.

When the drawing is finished, the material 32 is ejected from the vacuum chamber 71 by means of the conveyance unit 86 in the load lock 84.

The description has been made for the drawing apparatus as one example. A drawing apparatus according to the present invention is configured to record information on a surface of a material with the use of an electron beam emitted by an electron beam applying apparatus according to the present invention, and nothing other than it is limited. For example, in the above-described embodiment, the material is made to turn while the material is moved in one direction, when drawing is carried out. However, the material may be moved in two directions, i.e., the arrow X direction and a Y direction perpendicular thereto. Further alternatively, drawing may be carried out in a condition in which the material is moved in three directions, i.e., XYZ directions including a Z direction which is a vertical direction in FIG. 4.

Further, an electron beam applying apparatus and a drawing apparatus according to the present invention may also be applied for recording information to various types of information recording media such as a hologram memory or such, other than recording information to an optical medium such as a DVD.

Further, the present invention is not limited to the above-described embodiments, and variations and modifications may be made without departing from the basic concept of the present invention claimed in CLAIMS below.

The present application is based on Japanese Priority Applications No. 2004-214452, Jul. 22, 2004, the entire contents of which are hereby incorporated herein by reference.

The invention claimed is:

1. An electron beam applying apparatus for applying an electron beam to a surface of a material for recording information on the surface of the material, comprising: a thermal field emission type electron source emitting an electron beam; an electrostatic lens, disposed immediately below the electron source, acting as a condensing electrode for condensing the electron beam in a first angular aperture emitted by the electron source, in a second angular aperture smaller than the first angular aperture; a condenser lens disposed on a downstream side of the electrostatic lens, condensing the electron beam once condensed in the second aperture angle by the electrostatic lens, in a crossover point; and an objective lens disposed on a downstream side of the condenser lens, condensing the electron beam once condensed in the crossover point by the condenser lens, on the surface of the material, wherein: a beam diameter reduction ratio of the electron beam condensed on the surface of the material with respect to a beam diameter of the electron beam emitted by the electron source when the electrostatic lens is not applied is set within a range between 1 and 10.

2. The electron beam applying apparatus as claimed in claim 1, wherein: the beam diameter reduction ratio is set approximately equal to 1.

3. An electron beam applying apparatus for applying an electron beam to a surface of a material for recording information on the surface of the material, comprising: a thermal field emission type electron source emitting an electron beam; an electrostatic lens, disposed immediately below the electron source, acting as a condensing electrode for condensing the electron beam in a first angular aperture emitted by the electron source, in a second angular aperture smaller than the first angular aperture; a condenser lens disposed on a downstream side of the electrostatic lens, condensing the electron beam once condensed in the second aperture angle by the electrostatic lens, in a crossover point; an objective lens disposed on a downstream side of the condenser lens, condensing the electron beam once condensed in the crossover point by the condenser lens, on the surface of the material; an axis aligning coil disposed between the electrostatic lens and the condenser lens for correcting an axis shift of the electron beam applied to the condenser lens from the electrostatic lens; and a blanking electrode, disposed between the condenser lens and the objective lens, deflecting the electron beam condensed in the crossover point by the condenser lens.

4. The electron beam applying apparatus as claimed in claim 3, further comprising: an aperture acting both as a selector aperture and as an objective aperture, disposed between the condenser lens and the objective lens, on a downstream side of the blanking electrode, for controlling turning on/off of the electron beam together with the blanking electrode, according to information to be written, for a case of writing the information, wherein: the crossover point is set in the vicinity of, on an upstream or a downstream side of a hole part of said aperture.

5. A drawing apparatus configured to record information on a surface of a material with the use of an electron beam applied by the electron beam applying apparatus claimed in claim 1.

6. A drawing apparatus configured to record information on a surface of a material with the use of an electron beam applied by the electron beam applying apparatus claimed in claim 2.

7. A drawing apparatus configured to record information on a surface of a material with the use of an electron beam applied by the electron beam applying apparatus claimed in claim 3.

8. A drawing apparatus configured to record information on a surface of a material with the use of an electron beam applied by the electron beam applying apparatus claimed in claim 4.

* * * * *